US010580588B2

(12) United States Patent
Miguez et al.

(10) Patent No.: US 10,580,588 B2
(45) Date of Patent: Mar. 3, 2020

(54) SOLAR TO ELECTRIC ENERGY CONVERSION DEVICE

(71) Applicant: NLAB Solar AB, Stockholm (SE)

(72) Inventors: Hernan Miguez, Seville (ES); Silvia Colodrero, Baena (ES)

(73) Assignee: EXEGER OPERATIONS AB, Stockholm (SE)

( * ) Notice: Subject to any disclaimer, the term of this patent is extended or adjusted under 35 U.S.C. 154(b) by 582 days.

(21) Appl. No.: 15/014,298

(22) Filed: Feb. 3, 2016

(65) Prior Publication Data

US 2016/0155573 A1    Jun. 2, 2016

Related U.S. Application Data

(63) Continuation of application No. 12/988,451, filed as application No. PCT/EP2009/054534 on Apr. 16, 2009, now abandoned.

(60) Provisional application No. 61/046,212, filed on Apr. 18, 2008.

(51) Int. Cl.
*H01G 9/20* (2006.01)
*H01G 9/00* (2006.01)

(52) U.S. Cl.
CPC ........... *H01G 9/209* (2013.01); *H01G 9/0029* (2013.01)

(58) Field of Classification Search
CPC .... H01G 9/209; H01G 9/0029; H01G 9/2031; H01G 9/2036; H01G 9/2059; Y02P 70/521; H01L 51/0086; Y02E 10/542
See application file for complete search history.

(56) References Cited

U.S. PATENT DOCUMENTS

| 5,350,644 A * | 9/1994 | Graetzel .............. H01G 9/2031 429/111 |
| 7,087,915 B2 | 8/2006 | Takahashi et al. |
| 2003/0029496 A1 | 2/2003 | Wada et al. |
| 2004/0250848 A1 | 12/2004 | Sager et al. |

(Continued)

FOREIGN PATENT DOCUMENTS

| JP | 2003-329797 A | 11/2003 |
| JP | 2005-197140 A | 7/2005 |

(Continued)

OTHER PUBLICATIONS

Nishimura Suzushi et al., "Standing Wave Enhacement of Red Absorbance and Photocurrent in Dye-Sensitized Titanium Dioxide Phtoelectrodes Coupled to Photonic Crystals", Journal of the American Chemical Society, American Chemical Society, New York, USA, vol. 125, No. 20, May 21, 2003 (May 21, 2003), pp. 6306-6310, XP002358669, ISSN: 0002-7863.

(Continued)

*Primary Examiner* — Peniel M Gumedzoe
(74) *Attorney, Agent, or Firm* — Polsinelli PC

(57) ABSTRACT

The present invention features a solar-to-electric energy conversion device based on a light absorbing electrode coupled to a one-dimensional nanoparticle based photonic crystal. The function of the latter is to localize the incident light within the electrode thus enhancing the optical absorption and the power conversion efficiency of the so called dye-sensitized and organic (polymer based or hybrids) cell. The photonic crystal comprises alternating layers possessing different index of refraction and can be easily integrated into the cell.

12 Claims, 4 Drawing Sheets

(56) References Cited

U.S. PATENT DOCUMENTS

| | | | |
|---|---|---|---|
| 2005/0109390 A1 | 5/2005 | Shimomura et al. | |
| 2006/0065301 A1 | 3/2006 | Miyoshi | |
| 2006/0137739 A1* | 6/2006 | Imoto | H01G 9/2031 |
| | | | 136/263 |
| 2006/0174936 A1* | 8/2006 | Di Palma | H01G 9/2009 |
| | | | 136/263 |
| 2007/0062576 A1 | 3/2007 | Duerr et al. | |
| 2007/0235072 A1 | 10/2007 | Bermel et al. | |
| 2007/0240761 A1* | 10/2007 | Miteva | H01L 51/4226 |
| | | | 136/263 |
| 2007/0258147 A1 | 11/2007 | Van Der Boom et al. | |
| 2007/0269923 A1 | 11/2007 | Lee et al. | |

FOREIGN PATENT DOCUMENTS

| | | |
|---|---|---|
| JP | 2006-024495 A | 1/2006 |
| JP | 2006-100180 A | 4/2006 |
| JP | 2006-310729 A | 11/2006 |
| JP | 2007-035594 A | 2/2007 |

OTHER PUBLICATIONS

Mihi A et al., "Enhanced Power Conversion Efficiency in Solar Cells Coupled to Photonic Crystals", Proceedings of SPIE—The International Society for Optical Engineering—Active Photonic Crystals 2007 SPIE US, vol. 6640, 2007, XP0002573391, pp. 664007-6-pp. 6640007-7.

Zhizhong Wu et al., "Structural Color in Porous, Superhydrophilic, and Self-Cleaning SiO2/TiO2 Bragg Stacks", Small Wiley-VCH Verlag GMBH Germany, vol. 3, No. 8, Aug. 3, 2007 (Aug. 3, 2007), pp. 1445-1451, XP002573392, ISSN: 1613-6810.

Japanese Office Action dated Sep. 17, 2013.

New Zealand Office Action dated Jul. 24, 2012.

Edrington, Alexander C., et al., "Polymer-Based Photonic Crystals", Advanced Materials, 2001, 13, No. 6, pp. 421-425.

Sibilia, C. et al., "Electromagnetic properties of periodic and quasi-periodic one-dimensional, metallo-dielectric photonic band gap structures", 1999, J. Opt. A: Pure Appl. Opt. 1, pp. 490-494.

Mihi, A. and Miguez, H., "Origin of Light-Harvesting Enhancement in Colloidal-Photonic-Crystal-Based Dye-Sensitized Solar Cells", 2005, J. Phys. Chem., B, 109, pp. 15968-15976.

Almeida, Rui M. and Portal, Sabine, "Photonic band gap structures by-sol-gel processing", Current Opinion in Solid State and Materials Science 7, 2003, pp. 151-157.

Office Action dated Apr. 7, 2018 in corresponding United Arab Emirates Patent Application No. P1069/10 (5 pages).

Search Report dated Apr. 7, 2018 in corresponding United Arab Emirates Patent Application No. P1069/10 (5 pages).

\* cited by examiner

SOLAR TO ELECTRIC ENERGY CONVERSION DEVICE

CROSS REFERENCE TO RELATED APPLICATIONS

This application is a Continuation of U.S. application Ser. No. 12/988,451, filed Oct. 18, 2010; which is a National Phase under 35 U.S.C. § 371 of PCT/EP2009/054534 filed on Apr. 16, 2009; which in turn claims benefit of U.S. Provisional Application No. 61/046,212 filed on Apr. 18, 2008 under 35 U.S.C. § 119; the entire contents of all of these documents are hereby incorporated by reference in their entireties.

FIELD OF THE INVENTION

The present invention relates to a solar-to-electric energy conversion device having a light absorbing electrode coupled to a porous photonic crystal or multilayer Bragg reflector. The porous reflecting element is used to enhance the power conversion efficiency of the solar cell device by selectively increasing the optical absorption in the electrode.

BACKGROUND OF THE INVENTION

The research on different solar-to-electric energy conversion devices made of materials alternative to silicon has been boosted in recent years for a number of reasons such as the search for lower cost processes or added value features, such as transparency. Among them, one of the devices that have shown higher efficiency is dye-sensitized solar cells (DSSC), also known as Grätzel cells, U.S. Pat. No. 5,084,365. The DSSC combine a solid wide band gap semiconductor with a liquid ionic conductor. The former usually consists of one electrode made of a layer of a few micrometers of titanium dioxide nanocrystals (nc-$TiO_2$, average crystal size around 20 nm), on whose surface a dye, typically a Ruthenium polypyridyl complex, is adsorbed. This nanocrystalline film is deposited onto a conductive, transparent substrate, typically indium tin oxide (ITO) or fluorinated $SnO_2$, and soaked with a redox electrolyte, typically containing $I^-/I_3^-$ ion pairs. This electrolyte is also in contact with a colloidal platinum catalyst coated counter-electrode. Sunlight is harvested by the dye producing photo-excited electrons that are injected into the conduction band of the nanocrystalline semiconductor network, and then into the conducting substrate. At the same time the redox electrolyte reduces the oxidized dye and transports the electron acceptors species ($I_3^-$) to the counter-electrode. A record value of power conversion efficiency of 11% has been reported, although good quality cells typically provide between 5% and 8%.

In order to improve the durability of the cell, different attempts to substitute the liquid electrolyte for solid state hole conductors, such as polymers, or ionic liquids have been performed. Although stability is improved, lower values of efficiency are achieved.

Current efficiencies of the different types of Grätzel cells are still low compared to silicon based devices, which have an average power conversion efficiency of 15%, there is no doubt that they have a great potential for different reasons. First, although the efficiency is lower, there is a need for alternative materials to silicon that can be used for photovoltaic applications. The Grätzel cells can be made transparent, which implies they can be used as coatings on windows. The cells also have a potential to be made flexible, which would simplify integration on different types of surfaces. Finally, they are usually made of less expensive materials than silicon, and there is a wide variety of compounds (semiconductors, dyes, electrolytes) that can be used to build the cells.

Many different modifications of the originally proposed cell have been made in order to improve its performance, most of them based on the use of different semiconductors, dyes or ionic conductor, or on alterations of its nanostructure. In many cases, however, a change of cell constituents gives rise to an improvement of the short circuit current, but causes at the same time a decrease of the open circuit voltage or vice versa. This is due to the extreme sensibility of the charge transport and recombination dynamics to any alteration of the nature of the interfaces present in the cell.

One way to enhance the cell efficiency without affecting the delicate kinetic balance between charge separation and recombination is to modify the optical design of the cell in order to improve its light harvesting efficiency (LHE) or absorbance. This approach relies basically on an increase of the optical path resulting from the scattering of non-absorbed light by a layer of disordered particles of large size (on the order of the targeted wavelengths) placed behind the absorbing electrode. Unfortunately, some of the most successful approaches developed for silicon photovoltaic devices to improve the LHE, which are based on the implementation of highly reflecting distributed Bragg reflectors, surface gratings, or a combination of both, cannot be easily realized for liquid-semiconductor hetero junction cells due to the following reasons:

1. The need of electrical contact between the electrolyte and the sensitized semiconductor slab in the latter forces any potential back reflector to be porous to allow a proper flow of the liquid conductor through it.
2. The processing of these cells involves deposition of solid layers from colloidal suspensions, which complicates the implementation of optical quality components within the device.

A potential solution to this problem has very recently been proposed through the implementation of highly porous photonic crystals in the solar cell structure (T. Mallouk et al. "*Standing wave enhancement of red absorbance and photocurrent in dye-sensitized titanium dioxide photoelectrodes coupled to photonic crystals*" J. Amer. Chem. Soc. 2003, 125, 6306; A. Mihi, H. Miguez, "*Origin of Light Harvesting Efficiency Enhancement in Photonic Cristal Based Dye-Sensitized Solar Cells*", J. Phys. Chem. B. 2005, 109, 15968). A photonic crystal is primarily classified depending on the number of spatial dimensions along which there exists a periodic modulation of the refractive index, then being divided in one-dimensional (1D), two-dimensional (2D) and three-dimensional (3D) photonic crystals. One of their most representative features is their ability to diffract light.

In WO 2008102046 is disclosed a multilayer structure made of nanoparticles behaving as a one-dimensional photonic crystal for use in optical chemical sensing devices or frequency selective filters.

Coupling of a generic porous dielectric mirror in dye-sensitized solar cells is shown in the publication by A. Mihi et al. "Origin of light harvesting efficiency enhancement in photonic crystal based dye-sensitized solar cells", J. Phys. Chem. B 2005 109, 15968.

DESCRIPTION OF THE INVENTION

The present invention features a solar-to-electric energy conversion device based on a light absorbing electrode coupled to a nanoparticle based one dimensional photonic crystal. The function of the latter is to localize the incident light within the electrode thus enhancing the optical absorption and the power conversion efficiency of dye-sensitized, organic (polymer based or hybrid) devices. The photonic crystal comprises alternating layers possessing different index of refraction and can be easily integrated into the cell. The alternation of layers of different refractive index provides the structure with one-dimensional photonic crystal properties necessary to efficiently localize the incident light within the absorbing layer. Each layer in the multilayer photonic crystal is made of nanoparticles and its porosity allows the electrolytes and the absorbing compounds to flow through the multilayer. This ensures good electrical contact with the rest of the components, while not affecting the charge transport through the cell.

The introduction of a one-dimensional photonic crystal within a solar cell gives important qualitative improvements with respect to previous designs of organic solar cells and affects both the fabrication procedure and the product so obtained.

A method for manufacturing a solar to electric energy conversion device comprises the following steps:
  a) depositing a layer of a nanocrystalline semi-conducting compound on a transparent conducting substrate;
  b) preparing suspensions of nanoparticles in liquid media;
  c) depositing a porous multilayer having photonic crystal properties on the semi-conducting layer, forming a structure of alternated nanoparticle layers of controlled thickness, so that a periodic or quasi-periodic spatial modulation of a refractive index across the multilayer is achieved;
  d) heating the structure to a temperature between 100° C. and 550° C.
  e) sensitising the structure with a dye, by immersing the structure in a solution of the dye;
  f) preparing a counter-electrode
  g) sealing the electrode and counterelectrode, thus forming a cell, infiltrating the space between them with a conducting electrolyte that may be liquid or solid.

The steps e) and g) could be replaced with the respective steps e') infiltrating the structure with a conducting polymer and g') sealing the electrode and counterelectrode, thus forming a cell.

The solar to electric energy conversion device can be characterised by the following steps of manufacturing:
  A') depositing a layer of a hole conducting polymer compound on a transparent conducting substrate;
  B') depositing a layer of a conducting polymer compound or polymer-fullerene blend compound onto the previously deposited layer;
  C') preparing different suspensions of nanoparticles in liquid media;
  D') depositing a multilayer having high porosity and photonic crystal properties on the polymer or polymer-fullerene blend layer deposited in step (b), thus forming a structure of alternated nanoparticle layers of controlled thickness, so that a periodic or quasi-periodic spatial modulation of a refractive index across the multilayer is achieved;
  E') infiltrating the nanoparticle based multilayer with the same polymer or polymer-fullerene blend used in (b);
  F') preparing a counter-electrode that is in electrical contact with the polymer or polymer-fullerene blend used in (b), sealing the cell.

In the step of depositing a porous multilayer there could be a porous tandem multilayer structure having photonic crystal properties over a larger range of wavelengths on the semi-conducting layer, thus forming a structure of alternated nanoparticle layers of controlled thicknesses, so that a periodic or quasi-periodic spatial modulation of a refractive index across the periodic structure is achieved.

Depositing of the multilayer can be done by various techniques for example by such techniques as doctor blade, dip coating, spin-coating or by the Langmuir-Blodgett technique. Ink jet printing would also be a possible depositing technique.

The solar to electric energy conversion device having a structure of alternated nanoparticle layers of controlled thickness, so that a periodic or quasi-periodic spatial modulation of the refractive index across the multilayer is achieved can be a dye-sensitized solar cell, a hybrid solar cell or a polymer solar cell.

The suspensions of nanoparticles could be different suspensions of nanoparticles or suspensions having the nanoparticles of the same chemical composition but different size distribution.

BRIEF DESCRIPTION OF THE DRAWINGS

FIG. 1(a) shows a scheme of the 1D PC based solar cell showing the illumination through the dye coated titanium dioxide layer. FIG. 1(b) shows an FE-SEM image showing a cross-section of a cleaved nc-$TiO_2$—$SiO_2$ periodic structure (lower vertical line) grown on top of a dye-sensitized nc-$TiO_2$ electrode (top vertical line). Transparent conducting substrate is placed at the top of this picture. FIG. 1(c) shows a magnified view of the silica (spherical particles) and titania (smaller crystallites) nanocolloids composing the 1-D photonic crystal.

FIG. 2(a) shows an FESEM image corresponding to a cross-section of a cleaved nc-TiO2-SiO2 tandem structure (vertical white line) deposited onto a dye coated titanium dioxide electrode (vertical dot line). A transparent conducting substrate is placed at the top of this picture. FIG. 2(b) shows a magnified view of the tandem multilayer structure built on top the electrode. Two photonic crystals of different lattice parameter made each one of six alternate layers can be clearly distinguished. The lattice parameters are 220±10 nm (photonic crystal denoted as PhC1) and 150±10 nm (photonic crystal denoted as PhC2), respectively.

DETAILED DESCRIPTION OF THE INVENTION

Figure 1:
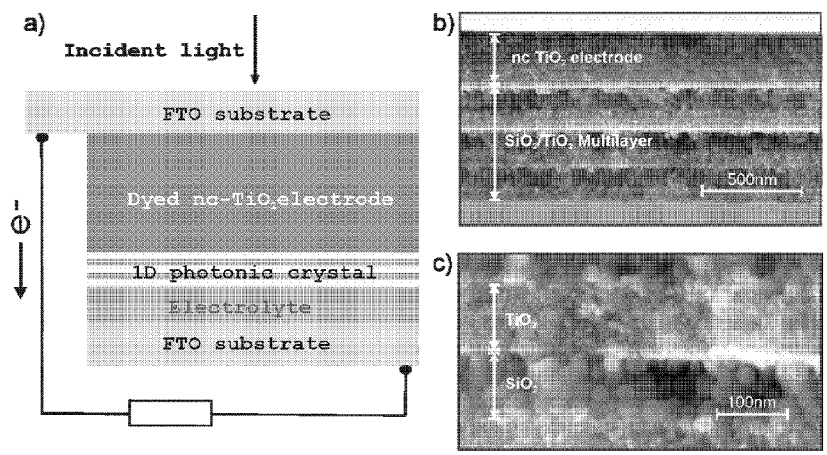
FIG. 1a-c show the design and microstructure of a dye-sensitized solar cell coupled to a porous nanoparticle based 1-D photonic crystal.

The manufacturing process for an electric energy conversion device will be described in further detail. The steps of preparing a dye-sensitized solar cell can comprise the below steps.

a) Preparation of a layer of nanocrystalline titanium oxide through a standard technique typically employed in the field, such as doctor blade, dip coating, spin-coating etc. deposited onto a transparent conducting substrate (typically made of thin layers of indium tin oxide or fluorinated tin oxide deposited onto standard glass wafers) and whose thickness is uniform and normally between 100 nm and 100 microns.

b) Preparation of suspensions of particles with sizes within the range of 1-100 nm, and made of any compound that can form nanoparticles. The suspension media is any media in which the particles can be dispersed and the concentration of nanoparticles can be between 1% and 99% (solid volume/liquid volume ratio).

c) Preparation of a multilayer with high porosity and photonic crystal properties. This multilayer is formed by alternate deposition of layers of controlled thickness of the nanoparticles mentioned in b) so that a periodic or quasiperiodic spatial modulation of the refractive index is attained across the multilayer. The modulation determines the photonic crystal properties of the multilayer. The deposition of these layers can be achieved by spin-coating, dip-coating or by the Langmuir-Blodgett technique using as precursor suspensions those described in step b). Step c) could alternatively be performed by using ink jet techniques. Thus, the deposition of a porous multilayer having photonic crystal properties on the semi-conducting layer, forming a structure of alternated nanoparticle layers of controlled thickness, so that a periodic or quasi-periodic spatial modulation of a refractive index across the multilayer could alternatively be achieved by using ink-jet techniques.

The deposition methods are not limited to these, other methods could be used. The thickness of each one of the nanoparticle layers that form the multilayer is between 1 nm and 1 micron. The number of nanoparticle layers in the multilayer can vary between 1 and 100.

The integration of the porous photonic nanostructure onto the semiconductor oxide layer described in a) comprises the following specific features:

d) Heating of the structure described in c) up to a temperature between 100° C. and 550° C., for example heating of the structure to 450° C.

e) Sensitisation of the structure formed by the semiconductor layer on which a one-dimensional photonic crystal is deposited as described in c) and treated as described in c) with the desired dye, through immersion of the structure in a solution of the dye.

The preparation procedure of the dye-sensitized cell varies depending on the type of electrolyte to be used (liquid, ionic liquid, solid state), as well as on the way the counter-electrode is prepared. The present invention can be employed with any of the different versions of the dye-sensitized cells.

The following description is an example of a procedure to prepare a liquid electrolyte based dye-sensitized solar cell for use to show the enhancement of power conversion efficiency possible.

Preparation of a counter-electrode can be made by any of the standard procedures employed in the field. Typically, it is made by deposition of a colloidal suspension of a catalyst metal (such as platinum) on a transparent conducting substrate like the one employed to support the electrode described in a). Later heating up to 400° C. for half an hour results in a deposition of a conducting coating that also behaves as a catalyst for the reduction of ions I$^-$ to I$^{3-}$.

f) Sealing of the cell through any of the methods typically employed in the field. Sealers are usually thin polymer layers (<100 microns) that are cut in the shape of a frame that serve both to glue the two electrodes together along their edges and as a spacer for the central areas of the two electrodes. Heating at temperatures around 100° C. produces the softening of the polymer frame that glues the two electrodes together sealing the cell for later infiltration with the liquid electrolyte.

g) Infiltration of the conducting liquid electrolyte through a hole perforated in the sealant polymer frame. This electrolyte can be any among the generally employed in the field.

The metal oxide that forms the layer described in a) can be made of any compounds attainable in the shape of crystallites with sizes between 2 nm and 300 nm, for example between 5 and 100 nm. As example the compound is selected among the following group: $TiO_2$, $SnO_2$, $CeO_2$, ZnO, $Nb_2O_5$. One implementation comprises the oxide $TiO_2$ chosen due to its particular physical-chemical properties.

The nanoparticles mentioned in b) can be made of any compound attainable in the shape of nanoparticles with sizes between 1 nm and 100 nm. The nanoparticles used are those, or a mixture of those, that allow a refractive index contrast between alternate layers forming the multilayer to be attained. The composition of the nanoparticles can be in the form of metal oxides, metal halides, nitrides, carbides, chalcogenides, metals, semiconductors, polymers or a mixture of those. More specifically, the materials forming the nanoparticles can be selected among any of the following list of compounds either in its amorphous or its crystalline form: $SiO_2$, $TiO_2$, $SnO_2$, ZnO, $Nb_2O_5$, $CeO_2$, $Fe_2O_3$, $Fe_3O_4$, $V_2O_5$, $Cr_2O_3$, $HfO_2$, $MnO_2$, $Mn_2O_3$, $Co_3O_4$, NiO, $Al_2O_3$, $In_2O_3$, $SnO_2$. CdS, CdSe, ZnS, ZnSe, Ni, Co, Fe, Ag, Au, Se, Si, and Ge. For example, nanoparticles made of $SiO_2$ and $TiO_2$, give rise to a very large refractive index contrast in the multilayer. These nanoparticles are used for the particular realization of the invention shown in examples 1 and 2.

Regarding the deposition techniques to form the nanoparticle layers forming the multilayer described in c), it can be any that allows one to attain a layer of nanoparticles with thickness comprised between 1 nm and 1 micron, such as spin-coating, Langmuir-Blodgett or dip-coating. For example, spin-coating is a suitable technique. By alternate deposition of nanoparticles of different kind (composition or size distribution of the suspension) a multilayer structure in which there is a spatial modulation of the refractive index and therefore displays photonic crystal properties is achieved.

It is also possible that all layers in the multilayer described in c) are made of nanoparticles of the same material as long as the multilayer presents a spatial modulation of the refractive index in the direction perpendicular to the layers' surface, providing the structure with the desired photonic crystal properties. This can be achieved by controlling the size distribution in the nanoparticles that form each layer, since it will determine the porosity of the layer and hence its refractive index.

Figure 2:
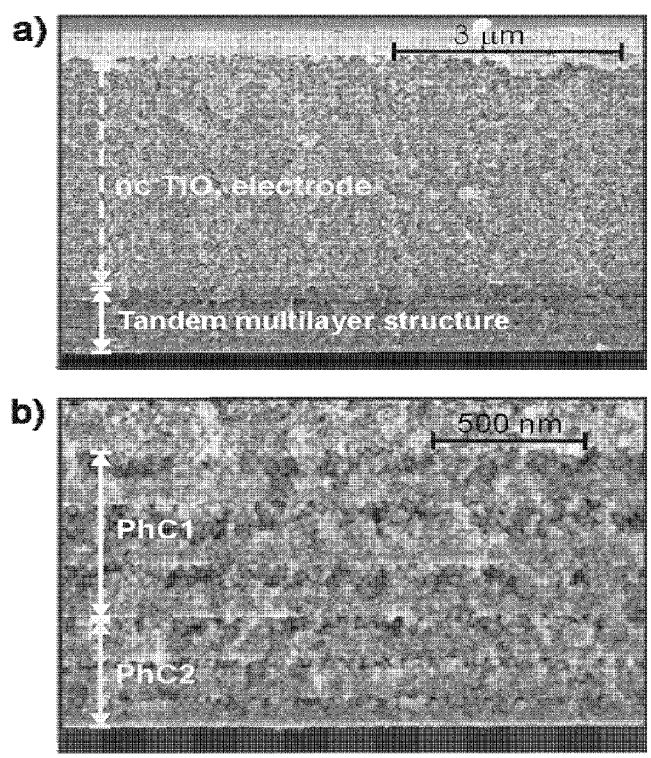
FIG. 2a-b show microstructures of a dye-sensitized solar cell coupled to a tandem multilayer structure.

It is also possible that the multilayer structure deposited onto the semiconductor oxide layer as described in c) is built as a tandem multilayer structure. In that case, one dimensional photonic crystals with different lattice parameters can be deposited consecutively on the electrode by modifying the concentration of the nanoparticle suspensions that are employed to build each one of them, as described in b). These tandem structures allow one to attain photonic crystal properties in a wider range of wavelengths, so expecting to enhance the optical absorption and the power conversion efficiency of the cells coupled to these structures with respect to those using a single photonic crystal. In FIG. 2 it is shown a cross-section image corresponding to a titanium dioxide electrode coupled to a tandem multilayer structure made of two photonic crystals with different lattice parameter.

The dispersions or suspensions which are used as precursors to deposit the thin nanoparticle layers that form the multilayer employ as liquid dispersion medium any dispersant of the nanoparticles. Preferably, the liquid medium is volatile. This liquid can be selected from among the group of water, alcohols, or alicyclic, aromatic, or aliphatic hydrocarbons, for example water, ethanol, ethyleneglycol and methanol, pure or mixed in any proportion are used.

The dye mentioned in e) and employed to sensitize the structure described in d) can be any dye capable of absorbing part of the solar spectrum and of transferring the photogenerated charge to the semiconductor oxide layer described in a). For example, the dye can be selected among the group of dyes containing an atom of ruthenium in its molecular form.

The electrolyte, mentioned in g), employed to infiltrate the cell in order to create electrical contact between the different components, can be any of those used in the field, either in liquid or solid state phase. For example, it may be selected among those that contain mixtures of ions $I^-/I_3^-$.

A solar cell fabricated following the procedures described above, will show a higher solar-to-electric power conversion efficiency than a solar cell of similar characteristics (materials, compounds, dye loading, and electrode thickness) but lacking integration of a nanoparticle based one dimensional photonic crystal. This is illustrated in the examples provided.

These concepts apply not only to the case of the dye-sensitized solar cell, but also to other photovoltaic devices based on organic compounds, used as light harvesters or for charge transport. This group of solar to electric energy conversion devices is related to the dye-sensitized cell we use as example of the invention. The manufacturing process for the case of integration of porous one dimensional photonic crystals of the sort herein described within hybrid solar cells, in which the nanocrystalline titanium oxide layer is infiltrated with a liquid or gel precursor of a targeted conducting polymer that will provide both light absorption and charge transport, would be:

A) depositing a layer of a nanocrystalline semi-conducting compound on a transparent conducting substrate;
B) preparing different suspensions of nanoparticles in liquid media;
C) depositing a multilayer having high porosity and photonic crystal properties on the semi-conducting layer, thus forming a structure of alternated nanoparticle layers of controlled thickness, so that a periodic or quasi-periodic spatial modulation of a refractive index across the multilayer is achieved;
D) heating the structure to a temperature between 100° C. and 550° C.
E) infiltrating the structure with a conducting polymer;
F) preparing a counter-electrode;
G) sealing the electrode and counterelectrode, thus forming a cell.

Also, the manufacturing process for the case of integration of porous one dimensional photonic crystals of the sort herein described within polymer solar cells, which, in its standard form, present a layered structure made by the sequential deposition different polymers, would be:

a) depositing a layer of a hole conducting polymer compound on a transparent conducting substrate;
b) depositing a layer of a conducting polymer compound or polymer-fullerene blend compound onto the previously deposited layer;
c) preparing different suspensions of nanoparticles in liquid media;

d) depositing a multilayer having high porosity and photonic crystal properties on the polymer or polymer-fullerene blend layer deposited in step (b), thus forming a structure of alternated nanoparticle layers of controlled thickness, so that a periodic or quasi-periodic spatial modulation of the refractive index across the multilayer is achieved;

e) infiltrating the nanoparticle based multilayer with the same polymer or polymer-fullerene blend used in (b);

f) preparing a counter-electrode that is in electrical contact with the polymer or polymer-fullerene blend used in (b), sealing the cell.

Nanoparticle Synthesis

Nanocrystalline $TiO_2$ particles are synthesised by using a procedure based on the hydrolysis of titanium isopropoxide followed by a peptization process under hydrothermal conditions. 20 ml of titanium isopropoxide (97% Aldrich) was added to 36 ml of Milli-Q water and stirred for 1 hour. Once the alcoxide is hydrolysed, the product is filtered using 1.2 μm RTTP Millipore membranes, washed several times with distilled water and placed in a teflon reactor with 3.9 ml of tetramethylammonium hydroxide (~2.8M, Fluka). After homogeneizing the suspension with a stir bar, the reactor is placed in an oven preheated at 120° C., were it is kept for 3 hours. After this, a colloidal suspension of titanium oxide crystallites with anatase structure, as confirmed by X-ray diffraction, is obtained. Later centrifugation at 14,000 rpm for 10 minutes allows eliminating some large aggregates from the dispersion. A narrow distribution of nanocrystals centred on 5 nm was achieved after this process, as checked by photocorrelation spectroscopy and transmission electron microscopy measurements. Silicon oxide nanoparticles (20 nm) were purchased from Dupont (LUDOX® TMA colloidal silica, 34 wt. % suspension in $H_2O$). $TiO_2$ or $SiO_2$ nanoparticles are suspended in a mixture of water (21 vol. %) and methanol (79 vol. %) in order to be used as precursors for the spin-coating process leading to the formation of the 1D PC within the cell.

Fabrication and Structural Characterization of the Solar Cell Containing a 1D Photonic Crystal First, a layer of the abovementioned nanocrystalline $TiO_2$ particles is deposited onto a 25 mm×25 mm conducting transparent substrate (FTO coated glass, Hartford) by a combination of the doctor blade technique and spin-coating. A course rough layer is attained through the former, but a uniform and smooth surface is achieved in the final coating after a drop of a suspension of fine titania particles is spun onto it. For this work, total thickness ranges between 300 nm and 2 microns. Then, in order to build the Bragg reflector onto this coated substrate, layers of silica and the same nc-$TiO_2$ particles were deposited alternately by spin-coating 250 μl drops of their colloidal suspensions. For most cells, the titania coated conducting substrate was spun at 100 revolutions per second (rps). Periodic multilayers of different lattice parameter were attained by keeping the $TiO_2$ nanocrystal concentration constant at 5 wt. % and changing the silica concentration within the range comprised between 1 wt. % and 5 wt. % Alternatively, different rotation speeds comprised between 100 and 150 revolutions per second (rps) were used to control the thickness of each layer in the multilayer. The PC properties of this structure are evident to the naked eye already with four layers deposited due to the high dielectric contrast between the two types of constituent layers. In most cases, a six-layer stack was built. After this, the multilayer coated substrate was thermally annealed at 450° C. in order to sinter the titania nanocrystals and remove all water bonded to the particles surface. When the temperature reaches 120° C. during the cooling down process, the structure is removed from the furnace and immersed in a 0.025% wt. solution of ruthenium bypiridile dye (Rutenio 535-bis TBA, Solaronix) in ethanol overnight in order to assure a proper adsorption of the dye on the nc-$TiO_2$ surface. After this, the electrode is put into electrical contact with a platinum (Pt-catalyst T/SP, Solaronix) covered counterelectrode by infiltrating a liquid electrolyte in between them. The employed electrolyte is composed of 100 mM $I_2$ (Aldrich, 99.999%), 100 mM LiI (Aldrich, 99.9%), 600 mM $[(C_4H_9)_4N]I$ (Aldrich, 98%) and 500 mM 4-tert-butylpyridine (Aldrich, 99%). The solvent used in this case was 3-methoxy propionitrile (Fluka, ≥99%). The porous nature of the periodic multilayer allows the electrolyte to soak the sensitized nc-$TiO_2$ coating. Previously, a thin hot-melt polymeric window (Surlyn, 1702 Dupont) that softens at 120° C. was used as spacer and to seal the cell at the same time. Cross sections of the cell were imaged using a field emission scanning electron microscope Hitachi 5200 operating at 5 kV and without using any conducting coating.

Optical Reflectance Measurements

Optical characterization was performed using a Fourier transform infrared spectrophotometer (BRUKER IFS-66) attached to a microscope and operating in reflection mode. A ×4 objective with a numerical aperture of 0.1 (light cone angle±5.7°) was used to irradiate the solar cell and collect the reflected light at quasi-normal incidence with respect to its surface. A spatial filter was used to selectively detect light from 1 $mm^2$ circular regions of the sample.

Photoelectric Measurements

Incident photon to electric current conversion efficiencies (IPCE) were measured in the spectral range comprised between 400 nm and 800 nm illuminating the front side of the cell with a plane parallel beam coming from a 450 W Xenon lamp (Oriel) after being dispersed by a monochromator (Oriel) containing a 1200 lines/mm grating (Oriel). Slits were chosen to attain a 10 nm wavelength resolution. A silicon photodiode (Jaal) of known response was used as reference to extract the IPCE curves. IV curves were measured under white light illumination coming from the same light source plus UV and water IR filters. Currents were registered via a battery-operated potentiostat.

EXAMPLES

Example 1

Fabrication of the Dye-Sensitized Solar Cell 1

Figure 3:
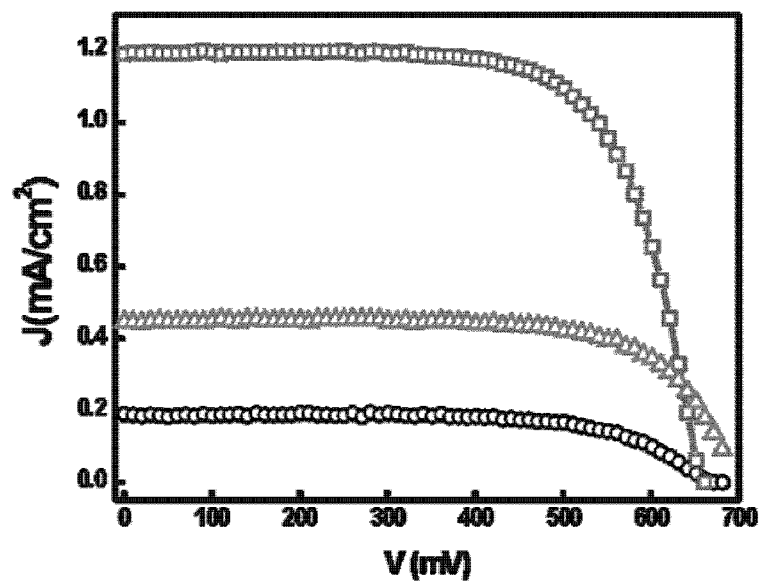
FIG. 3 shows current voltage curves under 1 sun illumination (100 mW/cm2) of a 350 nm thick dye-sensitized nc-TiO2 electrode coupled to different 1D photonic crystals. The lattice parameter in each case is 140±10 nm (squares) and 180±10 nm (triangles). In all cases, the TiO2 layer thickness is around 85±5 nm. The IV curve of a reference cell with the same electrode thickness is also plotted (black circles).
Figure 4:
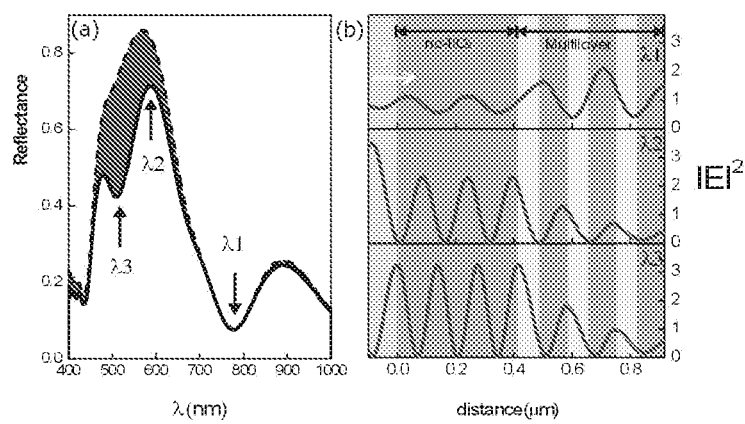
FIG. 4a-b show optical response of the dye-sensitized electrode coupled to a porous nanoparticle based 1-D photonic crystal. (a) Reflectance spectra of a 415 nm thick film of nc-$TiO_2$ followed by a 3 period thick 1D photonic crystal composed of 95±5 nm silica and 75±5 nm titania films measured under frontal (solid line) and rear (dashed line, shaded in red) illumination conditions. (b) Spatial distribution of the square amplitude of the electric field of the system described in (a) at three selected wavelengths from the spectrum attained for frontal illumination conditions, as obtained from the scalar wave approximation based fittings of the experimental reflectance. At the pass band, $\lambda_1=0.775$ microns; at a maximum of the reflectance peak, $\lambda_2=0.575$ microns; and at the dip in the reflectance peak, $\lambda_3=0.512$ microns.
Figure 5:
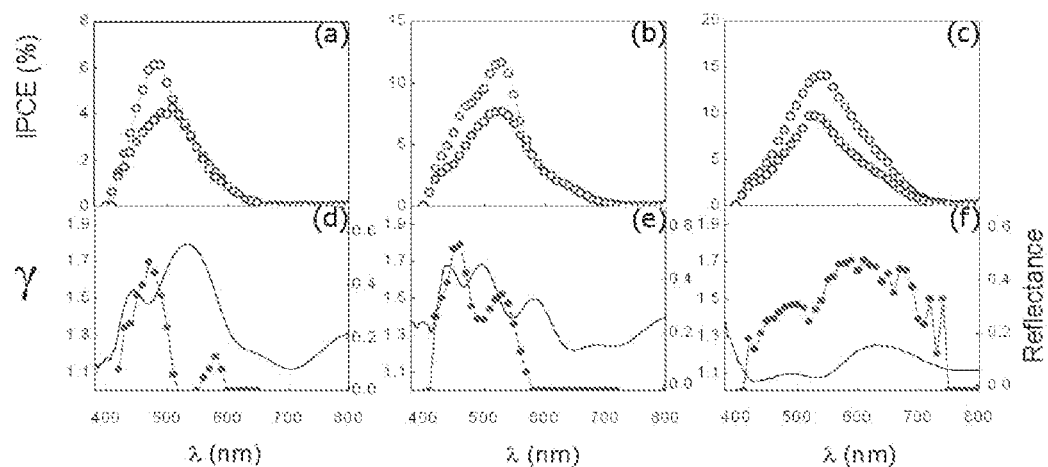
FIG. 5a-f show spectral response of the short circuit photocurrent of dye-sensitized electrodes of different thickness coupled to the same 1D photonic crystal. a-c Incident photon to current conversion efficiency (IPCE, %) versus wavelength for cells containing the same 1D photonic crystal coupled to a dye-sensitized nc-TiO2 layer of different thickness in each case (red circles). For comparison, we plot the IPCE for the same dye-sensitized nc-TiO2 layers without the photonic crystal (blue circles). (a) 350 nm nc-TiO2 film, (b) 600 nm nc-TiO2 film, (c) 1500 nm nc-TiO2 film. All of them are coupled to a 6 ML 1D photonic crystal (65±5 nm SiO2, 85±5 nm nc-TiO2). (d), (f) and (g) show the reflectance spectra of the 1D PC based solar cell (solid line) and the photocurrent enhancement factor γ (red circles), defined as the ratio between the IPCE of the 1D PC based cell and that of the standard for the systems described in (a), (b) and (c), respectively.

Dye-Sensitized Solar Cell coupled to a 1-Dimensional Photonic Crystal with lattice parameter of 180±10 nm (95±5 nm $SiO_2$-85±5 nm nc-$TiO_2$) presenting its reflectance maximum at 600 nm A 350 nm thick transparent titanium dioxide electrode is deposited by doctor-blading onto a previously cleaned 25 mm×25 mm conducting substrate (fluorine-doped SnO2 conducting glass, Hartford Glass). The anatase particle paste the electrodes are made of was purchased from Solaronix (Ti-Nanoxide HT, Solaronix). The TiO2 layer coated glass so prepared is heated to 450° C. during 30 minutes under oxygen for sintering. On the other hand, nanocrystalline TiO2 particles are synthesised by using a procedure reported by Burnside et al, based on the hydrolysis of titanium isopropoxide followed by a peptization process under hydrothermal conditions. In our case, 20 ml of titanium isopropoxide (97% Aldrich) are added to 36 ml of Milli-Q water and stirred for 1 hour. Once the alcoxide is hydrolysed, the product is filtered using 1.2 μm RTTP Millipore membranes. Then, it is washed several times with distilled water and placed in a teflon reactor with 3.9 ml of 0.6M tetramethylammonium hydroxide, obtained by diluting a commercial tetramethylammonium hydroxide solution in water (~2.8M, Fluka). After homogeneizing the suspension with a stir bar, the reactor is placed in a oven preheated at 120° C., were it is kept for 3 hours. After this, a colloidal suspension of titanium oxide crystallites with anatase structure, as confirmed by X-ray diffraction, is obtained. Later centrifugation at 14,000 rpm for 10 minutes allows eliminating some large aggregates from the dispersion achieving a narrow distribution of nanocrystals centred on 5 nm. Before building the Bragg reflector onto the coated substrate, a layer of the abovementioned fine titania particles is deposited by spin-coating in order to smooth the surface and obtain a uniform film. Then, in order to build the Bragg reflector onto this coated substrate, layers of silica and the same nc-TiO2 particles were deposited alternately by spincoating 250 ml drops of their colloidal suspensions. Silicon oxide nanoparticles (20 nm) were purchased from Dupont (LUDOX® TMA colloidal silica, 34 wt. % suspension in $H_2O$). The precursor suspensions for the spin-coating process are obtained by suspending $TiO_2$ or $SiO_2$ nanoparticles in a mixture of water (21 vol. %) and methanol (79 vol. %). The rotation speed is set at 100 rps during the spin-coating process, and the six layer periodic stack is made from silica (3 wt. % precursor solution) and titania (5 wt. % precursor solution) nanoparticles. The PC properties of this structure are evident to the naked eye already with four layers deposited due to the high dielectric contrast between the two types of constituent layers. After this, the multilayer coated substrate was thermally annealed at 450° C. in order to sinter the titania nanocrystals and remove all water bonded to the particles surface. When the temperature reaches 120° C. during the cooling down process, the structure is removed from the furnace and immersed in a 0.025% wt. solution of ruthenium bypiridile dye (Rutenio 535-bis TBA, Solaronix) in ethanol overnight in order to assure a proper adsorption of the dye on the nc-TiO2 surface. After this, the electrode is put into electrical contact with a platinum (Pt-catalyst T/SP, Solaronix) covered counterelectrode by infiltrating a liquid electrolyte in between them. The employed electrolyte is composed of 100 mM $I_2$ (Aldrich, 99.999%), 100 mM LiI (Aldrich, 99.9%), 600 mM $[(C_4H_9)_4N]I$ (Aldrich, 98%) and 500 mM 4-tert-butylpyridine (Aldrich, 99%). The solvent used in this case was 3-methoxy propionitrile (Fluka, ≥99%). The porous nature of the periodic multilayer allows the electrolyte to soak the sensitized nc-TiO2 coating. Previously, a thin hot-melt polymeric window (Surlyn, 1702 Dupont) that softens at 120° C. was used as spacer and to seal the cell at the same time. IV curves were measured under white light illumination coming from a 450 W Xenon lamp (Oriel) plus UV and water IR filters. Currents were registered via a battery-operated potentiostat. The IV curve corresponding to the dye-sensitized solar cell 1 is presented in FIG. 3 (triangles). In this graph it is also plotted the IV curve for a reference dye-sensitized solar cell without photonic crystal (black circles).

Example 2

Fabrication of the Dye-Sensitized Solar Cell 2

Dye-Sensitized Solar Cell coupled to a 1-Dimensional Photonic Crystal with lattice parameter of 140±10 nm (55±5 nm $SiO_2$-85±5 nm nc-$TiO_2$) presenting its reflectance maximum at 450 nm The same fabrication procedure mentioned in Example 1 is employed to build the dye-sensitized solar cell 2. In this case, the six layer periodic stack is made from silica (2 wt. % precursor solution) and titania (5 wt. % precursor solution) nanoparticles. The precursor suspensions for the spin-coating process are obtained by suspending $TiO_2$ or $SiO_2$ nanoparticles in a mixture of water (21 vol. %) and methanol (79 vol. %), and the rotation speed is kept at 100 rps during the spin-coating process. The IV curve corresponding to this dye-sensitized solar cell is presented in FIG. 3 (blue squares). The IV curve corresponding to a reference dye-sensitized sola cell is also shown in this graph (black circles). For this comparison, the same electrode thickness has been employed in all cases. It can be clearly seen that the power conversion efficiency of these thin electrodes can be improved up to 6 times by coupling the periodic multilayer structures.

Example 3

Fabrication of the Dye-Sensitized Solar Cell

Figure 6:
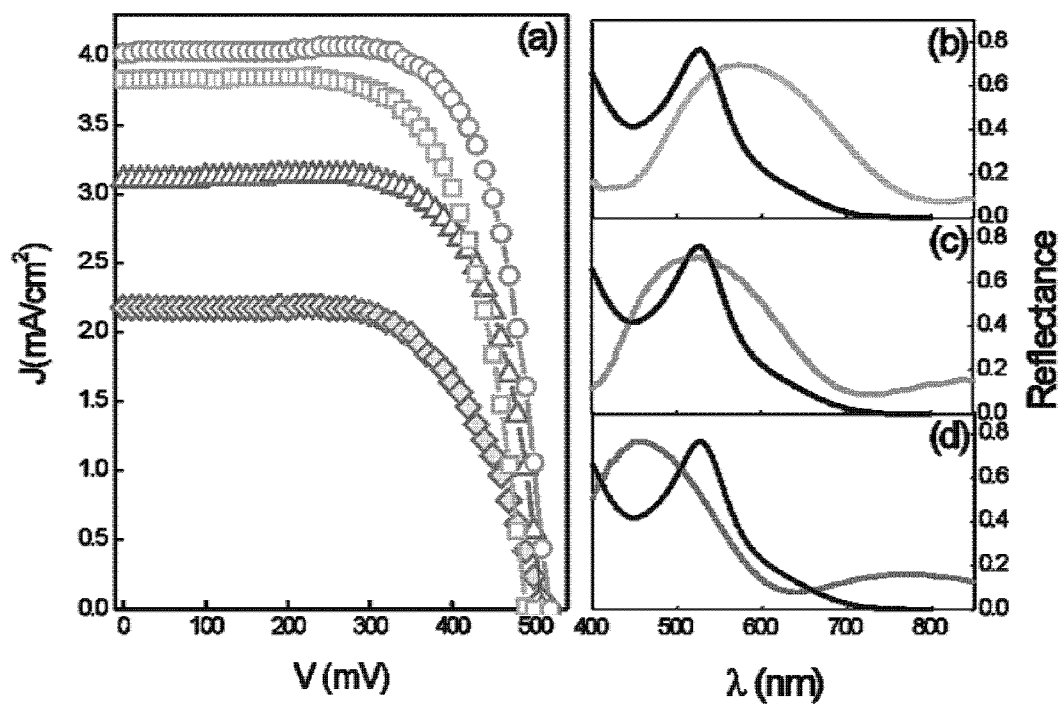
FIG. 6a-d show current density versus voltage bias curves for the dye-sensitized electrode coupled to different 1D photonic crystals. (a) Current density versus voltage under 1 sun illumination (100 mW/cm$^2$) of a 3 μl m thick nc-TiO$_2$ electrode coupled to 1D photonic crystals, each one presenting a different unit cell: 110±10 nm SiO$_2$-85±5 nm nc-TiO$_2$ (circles), 60±5 nm SiO$_2$-85±5 nm nc-TiO$_2$ (triangles), and 120±10 nm SiO$_2$-85±5 nm nc-TiO$_2$ (squares). The IV curve of a reference cell having the same nc-TiO$_2$ electrode thickness is also shown (filled diamonds). (b), (c) and (d) display the specular reflectance spectrum of each one of the cells versus the absorption spectrum of the ruthenium based dye (black solid line, in arbitrary units).
Figure 7:
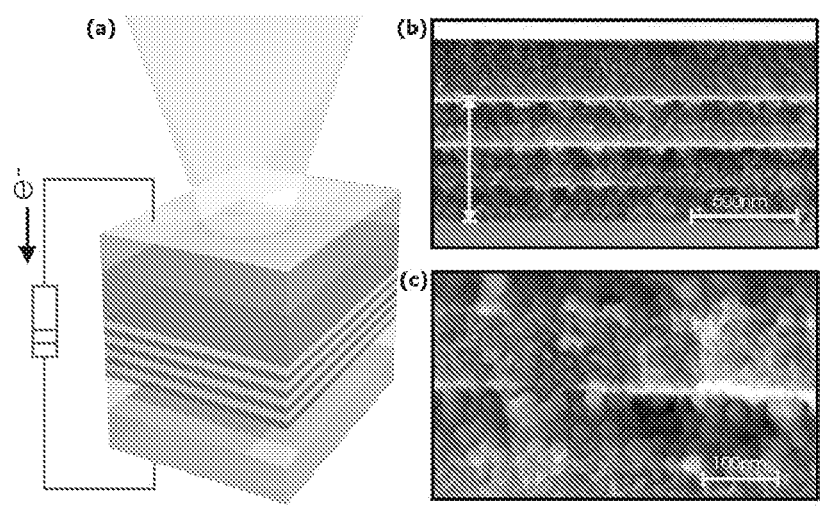
FIG. 7a-c show design and microstructure of a dye-sensitized solar cell coupled to a porous nanoparticle based 1-D photonic crystal. (a) Scheme of the 1D PC based solar cell exposed to frontal illumination. (b) FE-SEM image showing a cross-section of a cleaved nc-TiO$_2$—SiO$_2$ multilayer (Total thickness indicated by a vertical yellow line) grown on top of a dye-sensitized nc-TiO$_2$ electrode (vertical red line). Transparent conducting substrate is placed at the top of this picture. (c) Magnified view of the silica (spherical particles) and titania (smaller crystallites) nanocolloids composing the 1-D photonic crystal.

Dye-Sensitized Solar Cell coupled to a 1-Dimensional Photonic Crystal with lattice parameter of 195±15 nm (110±10 nm $SiO_2$-85±5 nm nc-$TiO_2$) presenting its reflectance maximum at 520 nm The same fabrication procedure mentioned in Example 1 is employed to build the dye-sensitized solar cell 3. In this case, the six layer periodic stack is made from silica (3 wt. % precursor solution) and titania (5 wt. % precursor solution) nanoparticles. The precursor suspensions for the spin-coating process are obtained by suspending $TiO_2$ or $SiO_2$ nanoparticles in a mixture of water (21 vol. %) and methanol (79 vol. %), and the rotation speed is kept at 100 rps during the spin-coating process. The IV curve and the specular reflectance spectrum corresponding to this dye-sensitized solar cell are presented in FIGS. 6a (circles) and 6b, respectively. In FIG. 6b is also plotted the absorption spectrum of the ruthenium based dye (black solid line, in arbitrary units). It is clearly seen that the higher efficiency is achieved when the reflectance spectrum of the dye-sensitized solar cell coupled to the photonic crystal overlap the absorption spectrum of the ruthenium based dye.

Example 4

Fabrication of the Dye-Sensitized Solar Cell

Dye-Sensitized Solar Cell coupled to a 1-Dimensional Photonic Crystal with lattice parameter of 145±10 nm (60±5 nm $SiO_2$-85±5 nm nc-$TiO_2$) presenting its reflectance maximum at 450 nm The same fabrication procedure mentioned in Example 1 is employed to build the dye-sensitized solar cell 4. In this case, the six layer periodic stack is made from silica (2.5 wt. % precursor solution) and titania (5 wt. % precursor solution) nanoparticles. The precursor suspensions for the spin-coating process are obtained by suspending $TiO_2$ or $SiO_2$ nanoparticles in a mixture of water (21 vol. %) and methanol (79 vol. %), and the rotation speed is kept at 100 rps during the spin-coating process. The IV curve and the specular reflectance spectrum corresponding to this dye-sensitized solar cell are presented in FIGS. 6a (triangles) and 6c, respectively. In FIG. 6c is also plotted the absorption spectrum of the ruthenium based dye (black solid line, in arbitrary units).

The invention claimed is:

1. A method for manufacturing a solar to electric energy conversion device, the method comprising:
   a) depositing a layer of a nanocrystalline semi-conducting compound on a transparent conducting substrate;
   b) preparing suspensions of nanoparticles in liquid media;
   c) depositing a porous multilayer having photonic crystal properties on the semi-conducting layer, forming a structure of alternated nanoparticle layers of controlled thickness, so that a periodic or quasi-periodic spatial modulation of a refractive index across the multilayer is achieved;
   d) heating the structure to a temperature between 100° C. and 550° C.;
   e) sensitising the structure with a dye, by immersing the structure in a solution of the dye;
   f) preparing a counter-electrode;
   g) sealing the electrode and counter-electrode, thus forming a cell,
   h) infiltrating, after the sealing, a space between the electrode and counter-electrode with a conducting electrolyte that may be liquid or solid.

2. The method for manufacturing a solar to electric energy conversion device in accordance with claim 1, characterised by that the solar to electric energy device is a dye-sensitized solar cell.

3. The method for manufacturing a solar to electric energy conversion device in accordance with claim 2, characterised by that the different suspensions of nanoparticles employed present a different composition or similar composition but different particle size or aggregation state.

4. The method for manufacturing a solar to electric energy conversion device in accordance with claim 1, characterised by that different suspensions of nanoparticles employed present a different composition or similar composition but different particle size or aggregation state.

5. The method for manufacturing a solar to electric energy conversion device in accordance with claim 1, characterised by that the suspensions of nanoparticles are suspensions selected among any of the following list of compounds either in its amorphous or its crystalline form: $SiO_2$, $TiO_2$, $SnO_2$, $ZnO$, $Nb_2O_5$, $CeO_2$, $Fe_2O_3$, $Fe_3O_4$, $V_2O_5$, $Cr_2O_3$, $HfO_2$, $MnO_2$, $Mn_2O_3$, $Co_3O_4$, $NiO$, $Al_2O_3$, $In_2O_3$, $SnO_2$, CdS, CdSe, ZnS, ZnSe, Ni Co, Fe, Ag, Au, Se, Si, and Ge.

6. The method for manufacturing a solar to electric energy conversion device in accordance with claim 1, characterised by that the porous multilayer is a deposited tandem porous multilayer structure having photonic crystal properties over a larger range of wavelengths on the semi-conducting layer, thus forming a structure of alternated nanoparticle layers of controlled thicknesses, so that regions of different periodicity of the refractive index are achieved.

7. The method for manufacturing a solar to electric energy conversion device in accordance with claim 1, characterised by that the multilayer is deposited by doctor blade, dip coating, spin-coating, the Langmuir-Blodgett technique or by ink jet printing.

8. A method for manufacturing a solar to electric energy conversion, the method comprising:
   a) depositing a layer of a nanocrystalline semi-conducting compound on a transparent conducting substrate;
   b) preparing suspensions of nanoparticles in liquid media;
   c) depositing a porous multilayer having photonic crystal properties on the semi-conducting layer, forming a structure of alternated nanoparticle layers of controlled thickness, so that a periodic or quasi-periodic spatial modulation of a refractive index across the multilayer is achieved;
   d) heating the structure to a temperature between 100° C. and 550° C.;
   e) infiltrating the structure with a conducting polymer;
   f) preparing a counter-electrode; and
   g) sealing the electrode and counter-electrode, thus forming a cell.

9. The method for manufacturing a solar to electric energy conversion device in accordance with claim 8, characterised by that the solar to electric energy device is a dye-sensitized solar cell.

10. The method for manufacturing a solar to electric energy conversion device in accordance with claim 8, characterised by that the different suspensions of nanoparticles employed present a different composition or similar composition but different particle size or aggregation state.

11. The method for manufacturing a solar to electric energy conversion device in accordance with claim 8, characterised by that the different suspensions of nanoparticles employed present a different composition or similar composition but different particle size or aggregation state.

12. The method for manufacturing a solar to electric energy conversion device in accordance with claim 8, characterised by that the suspensions of nanoparticles are suspensions selected among any of the following list of compounds either in its amorphous or its crystalline form: $SiO_2$, $TiO_2$, $SnO_2$, $ZnO$, $Nb_2O_5$, $CeO_2$, $Fe_2O_3$, $Fe_3O_4$, $V_2O_5$, $Cr_2O_3$, $HfO_2$, $MnO_2$, $Mn_2O_3$, $Co_3O_4$, $NiO$, $Al_2O_3$, $In_2O_3$, $SnO_2$, CdS, CdSe, ZnS, ZnSe, Ni, Co, Fe, Ag, Au, Se, Si, and Ge.

* * * * *